United States Patent
Simili et al.

(10) Patent No.: US 9,647,602 B1
(45) Date of Patent: May 9, 2017

(54) DETERMINATION OF STATOR WINDING RESISTANCE IN AN ELECTRIC MACHINE

(71) Applicant: GM GLOBAL TECHNOLOGY OPERATIONS LLC, Detroit, MI (US)

(72) Inventors: Dwarakanath V Simili, Novi, MI (US); Jihoon Jang, Sunnyvale, CA (US); Sinisa Jurkovic, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/932,613

(22) Filed: Nov. 4, 2015

(51) Int. Cl.
| | |
|---|---|
| *H02P 7/00* | (2016.01) |
| *H02P 29/00* | (2016.01) |
| *H02P 21/14* | (2016.01) |
| *G01R 31/34* | (2006.01) |
| *H02P 6/18* | (2016.01) |
| *H02P 9/00* | (2006.01) |

(52) U.S. Cl.
CPC ........ *H02P 29/0055* (2013.01); *G01R 31/343* (2013.01); *H02P 21/148* (2013.01)

(58) Field of Classification Search
CPC .... H02P 25/24; H02P 6/08; H02P 9/00; H02P 23/00; H02P 7/18; B60L 15/20; B60W 20/00; H02K 13/06; H02K 29/08
USPC ........................................................ 318/139
See application file for complete search history.

(56) References Cited

U.S. PATENT DOCUMENTS

| | | | | |
|---|---|---|---|---|
| 8,384,338 | B2* | 2/2013 | Lu ........................... | H02P 21/16 318/490 |
| 2002/0113615 | A1* | 8/2002 | Atarashi ............. | B60L 11/1803 318/400.01 |
| 2009/0189561 | A1* | 7/2009 | Patel .................... | H02H 7/0852 318/806 |
| 2010/0109586 | A1* | 5/2010 | Matsui .................... | B60L 11/14 318/400.04 |
| 2010/0194329 | A1* | 8/2010 | Lu ........................... | H02P 21/16 318/798 |
| 2011/0050141 | A1* | 3/2011 | Yeh ........................ | H02P 29/664 318/434 |

(Continued)

*Primary Examiner* — Bentsu Ro
*Assistant Examiner* — Said Bouziane
(74) *Attorney, Agent, or Firm* — Quinn IP Law

(57) ABSTRACT

An electric machine assembly includes an electric machine having a stator and a rotor. The stator has stator windings at a stator winding temperature ($t_S$) and the rotor is configured to rotate at a rotor speed ($\omega$). A controller is operatively connected to the electric machine and has a processor and tangible, non-transitory memory on which is recorded instructions for executing a method for determining stator winding resistance. The controller is configured to determine a high-speed resistance factor ($r_H$) which is based at least partially on the torque command (T*), the stator winding temperature ($t_S$), the rotor speed ($\omega$), a characterized torque error and the number of pole pairs (P). The controller may determine a total resistance value (R) based on a weighting factor (k), the high-speed resistance factor ($r_H$) and the low-speed resistance factor ($r_L$).

15 Claims, 2 Drawing Sheets

(56) References Cited

U.S. PATENT DOCUMENTS

| | | | |
|---|---|---|---|
| 2011/0084638 A1* | 4/2011 | Patel | B60K 1/02 318/400.32 |
| 2011/0279074 A1* | 11/2011 | Yeh | G01K 7/42 318/432 |
| 2012/0306422 A1* | 12/2012 | Hao | G01K 7/22 318/490 |
| 2013/0076277 A1* | 3/2013 | Jang | H02P 23/14 318/139 |
| 2014/0055103 A1* | 2/2014 | Dooley | B60L 3/0023 322/99 |
| 2015/0229249 A1* | 8/2015 | Jang | H02P 6/08 318/139 |

\* cited by examiner

US 9,647,602 B1

DETERMINATION OF STATOR WINDING RESISTANCE IN AN ELECTRIC MACHINE

TECHNICAL FIELD

The disclosure relates generally to the determination of stator winding resistance in an electric machine assembly.

BACKGROUND

An electric machine such as an interior permanent magnet machine generally includes a rotor having a plurality of magnets of alternating polarity. The rotor is rotatable within a stator which generally includes multiple stator windings and magnetic poles of alternating polarity. An electric machine, such as a motor, takes in electrical energy in terms of a potential difference and a current flow, converting it to mechanical work. Because electric machines are not 100% efficient, some of the electric energy is lost to heat, due to electrical resistance of the windings. The electrical resistance of the stator windings at high rotor speeds varies considerably with operating temperature and current.

SUMMARY

An electric machine assembly has an electric machine having a stator and a rotor. The stator has stator windings at a stator winding temperature ($t_S$) and the rotor is configured to rotate at a rotor speed ($\omega$). A controller is operatively connected to the electric machine and configured to receive a torque command ($T^*$). The controller has a processor and tangible, non-transitory memory on which is recorded instructions for executing a method for determining stator winding resistance. Execution of the instructions by the processor causes the controller to determine a high-speed resistance factor ($r_H$) for the stator windings. The high-speed resistance factor ($r_H$) is based at least partially on the torque command ($T^*$), the stator winding temperature ($t_S$), the rotor speed ($\omega$), a characterized torque error and the number of pole pairs (P) of the electric machine.

The controller may be configured to determine a low-speed resistance factor ($r_L$) for the stator windings based at least partially on a predefined wire coefficient ($\alpha$), a measured stator resistance ($r_0$) at a predefined measuring temperature ($t_0$), a temperature difference between the stator winding temperature ($t_S$) and a predefined measuring temperature ($t_0$) such that: $r_L = [r_0(1+\alpha^*(t_S-t_0))]$. The controller may be configured to determine a total resistance (R) for the stator windings based at least partially on a weighting factor (k) and the high and low-speed resistance factors such that $R = [k^*r_H + (1-k)^*r_L]$ and $0 \leq k \leq 1$. The controller may be operative to control at least one operating parameter of the electric machine based at least partially on the total resistance (R) for the stator windings to achieve improved performance and/or efficiency.

A first temperature sensor may be operatively connected to the controller and configured to measure the stator winding temperature ($t_S$). A second temperature sensor may be operatively connected to the controller and configured to measure a rotor temperature. A magnetic flux sensor may be operatively connected to the controller and configured to measure a magnetic flux of the electric machine. A method for determining the high and low-speed resistance factors and total resistance (R) is provided. The method and assembly described herein minimizes the use of extensive look-up tables and complex curve-fitting for estimating the variation in stator resistance at various rotor speeds. The method utilizes estimated magnetic flux (from a magnetic flux sensor or FEA model) and two independent torque estimations, such as using current-based (flux map) and active power-based estimates.

The high-speed resistance factor ($r_H$) accounts for variation in stator resistance when the rotor speed ($\omega$) is relatively high. The low-speed resistance factor ($r_L$) accounts for variation in stator resistance when the rotor speed ($\omega$) is relatively low. The weighting factor (k) may be one when the rotor speed ($\omega$) is at or above a predefined high speed threshold (e.g. $\omega \geq 5000$ rpm). The weighting factor (k) may be zero when the rotor speed ($\omega$) is at or below a predefined low speed threshold (e.g. $w \leq 3000$ rpm).

Determining the high-speed resistance factor ($r_H$) includes: obtaining a first function ($F_1$), via the controller, as a product of a look-up factor and the torque command ($T^*$), wherein the look-up factor is based at least partially on the rotor speed, the stator winding temperature ($t_S$) and a characterized torque error. The characterized torque error may be defined as the difference between any two independent or different estimates of torque produced by the machine. A second function ($F_2$) may be obtained, via the controller, as a sum of the first function ($F_1$), a torque achieved ($T_a$) at the rotor temperature and a predefined first constant (Y) such that: $F_2 = (F_1 + T_a + Y)$.

A third function ($F_3$) may be obtained, via the controller, as a product of a stator winding resistance ($r_C$) at a baseline temperature and a torque achieved ($T_C$) at the baseline temperature such that: $F_3 = (T_C^* T_C)$. A fourth function ($F_4$) may be obtained, via the controller, as a difference between a magnetic flux ($\psi_{tr}$) at the rotor temperature and a magnetic flux ($\psi_0$) at the baseline temperature such that: $F_4 = (\psi_{tr} - \psi_C)$. A fifth function ($F_5$) may be obtained, via the controller, as a product of the pole pair (P), the rotor speed ($\omega$), a commanded current ($i_d^*$) and an inductance factor ($L_{d0}$) such that: $F_5 = [P^* \omega^* i_d^* {}^* L_{d0}]$.

The high-speed resistance factor ($r_H$) may be obtained based at least partially on the second function ($F_2$), the third function ($F_3$), the fourth function ($F_4$) and the fifth function ($F_5$) such that: $r_H = [1/(2^* F_2)][2^* F_3 - (3^* F_4^* F_5)]$.

The above features and advantages and other features and advantages of the present disclosure are readily apparent from the following detailed description of the best modes for carrying out the disclosure when taken in connection with the accompanying drawings.

DETAILED DESCRIPTION

Figure 1:
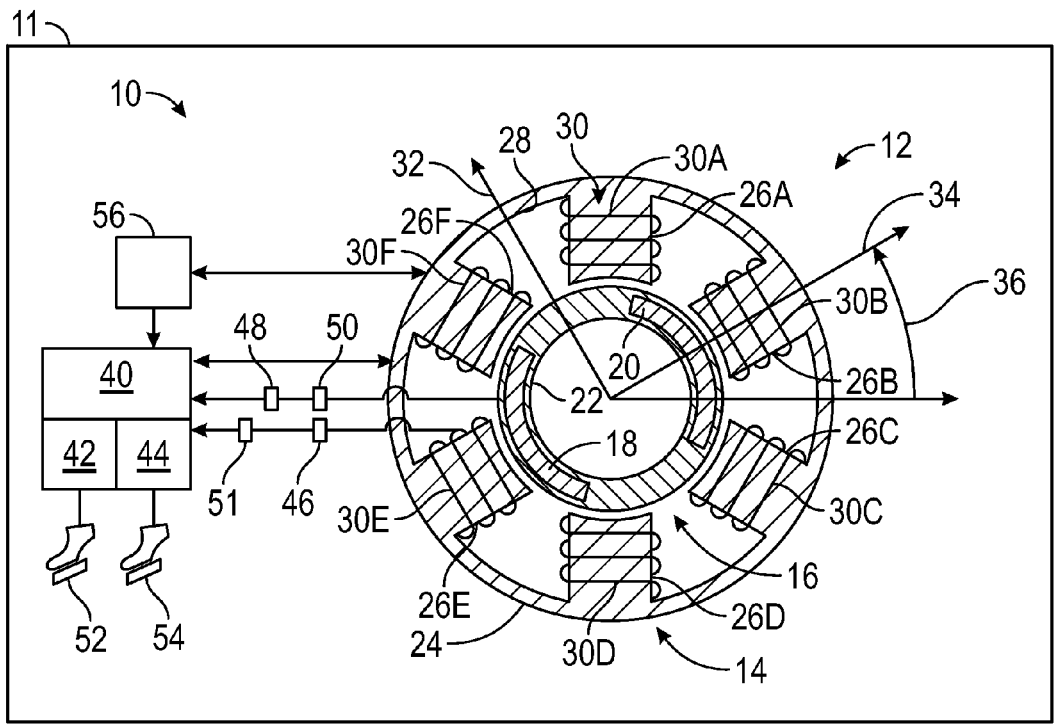
FIG. 1 is a schematic fragmentary partly sectional view of an electric machine assembly with a stator having a stator windings.

Referring to the drawings, wherein like reference numbers refer to like components, FIG. 1 schematically illustrates an electric machine assembly 10. The assembly 10 includes an electric machine 12. The assembly 10 may be a component of a device 11. The device 11 may be a passenger vehicle, performance vehicle, military vehicle, industrial vehicle, robot, farm implement, sports-related equipment or any other type of apparatus.

Referring to FIG. 1, the electric machine 12 includes a stator 14 and a rotor 16. The rotor 16 may include a first permanent magnet 18 and a second permanent magnet 20 of alternating polarity around the outer periphery of a rotor core 22. The rotor 16 may include any number of permanent magnets; for simplicity only two are shown. The rotor 16 is rotatable at a rotor speed ($\omega$) within the stator 14. While the embodiment shown in FIG. 1 illustrates a three-phase, single pole-pair (i.e. two pole) machine, it is understood that any number of phases or pole pairs may be employed.

The stator 14 includes a stator core 24 which may be cylindrically shaped with a hollow interior. The stator core 24 may include a plurality of inwardly-protruding stator teeth 26A-F, separated by gaps or slots 28. In the embodiment shown in FIG. 1, stator windings 30 may be operatively connected to the stator core 24, such as for example, being coiled around the stator teeth 26A-F. The electric machine 12 may take many different forms and include multiple and/or alternate components and facilities. While an example electric machine 12 is shown in the Figures, the components illustrated in the Figures are not intended to be limiting. Indeed, additional or alternative components and/or implementations may be used.

Electric current flowing in the stator windings 30 causes a rotating magnetic field in the stator 14. Referring to FIG. 1, the stator windings 30 may include six sets of windings; one set for each of three phases (the first phase through stator windings 30A and 30D, the second phase through stator windings 30B and 30E and the third phase through stator windings 30C and 30F). Alternatively, slip rings or brushes (not shown) may be employed. Referring to FIG. 1, a quadrature (q) magnetic axis 32 and a direct (d) magnetic axis 34 are shown. The first and second permanent magnets 18, 20 create a magnetic field and magnetic flux. The magnetic flux of the first and second permanent magnet fluxes 18, 20 are aligned when the rotor angle 36 is zero. As previously noted, the electric machine 12 may be of any type, including, but not limited to, induction and synchronous machines.

Referring to FIG. 1, the assembly 10 includes a controller 40 operatively connected to or in electronic communication with the electric machine 12. The controller 40 is configured to receive a torque command (T*). Referring to FIG. 1, the controller 40 includes at least one processor 42 and at least one memory 44 (or any non-transitory, tangible computer readable storage medium) on which are recorded instructions for executing method 100, shown in FIG. 2, for determining electrical resistance of the stator windings 30, including a high-speed resistance factor ($r_H$), a low-speed resistance factor ($r_L$) and a total resistance (R). The memory 44 can store controller-executable instruction sets, and the processor 42 can execute the controller-executable instruction sets stored in the memory 44. The method 100 and assembly 10 described herein minimizes the use of extensive look-up tables and complex curve-fitting for estimating the variation in stator resistance at various rotor speeds.

The controller 40 of FIG. 1 is specifically programmed to execute the steps of the method 100 (as discussed in detail below with respect to FIG. 2) and can receive inputs from various sensors. Referring to FIG. 1, the assembly 10 may include a first temperature sensor 46 (such as a thermistor or thermocouple) in communication (e.g., electronic communication) the controller 40, as shown in FIG. 1. The first temperature sensor 46 is capable of measuring the temperature of the stator windings 30A-F and sending input signals to the controller 40. The first temperature sensor 46 may be installed or mounted on one of the stator windings 30A-F. Alternatively, sensor-less stator winding temperature estimation techniques known to those skilled in the art may be employed, including, but not limited to: a high-frequency carrier signal injection technique and a motor thermal model computed based on machine geometry and its thermal and electrical properties. A second temperature sensor 48 may be in communication with the controller 40 and configured to measure the temperature of the rotor 16, referred to herein as the "rotor temperature."

Referring to FIG. 1, the assembly 10 may include a magnetic flux sensor 50 in communication (e.g., electronic communication) with the controller 40. The magnetic flux sensor 50 is capable of measuring the magnetic flux emanating from the electric machine 12, such as flux lines from permanent magnets 18, 20 in the rotor 16, and sending input signals to the controller 40. In one example, the magnetic flux sensor 50 is a Hall-effect sensor, however, any type of magnetic flux sensing device known to those skilled in the art may be employed. Additionally, controller 40 may be programmed to determine the magnetic flux based on other methods, without employing any sensors, such as finite element analysis (FEA) or any method or mechanism known to those skilled in the art. A battery pack 56 may be operatively connected to the machine 12 as a source of DC voltage.

Figure 2:
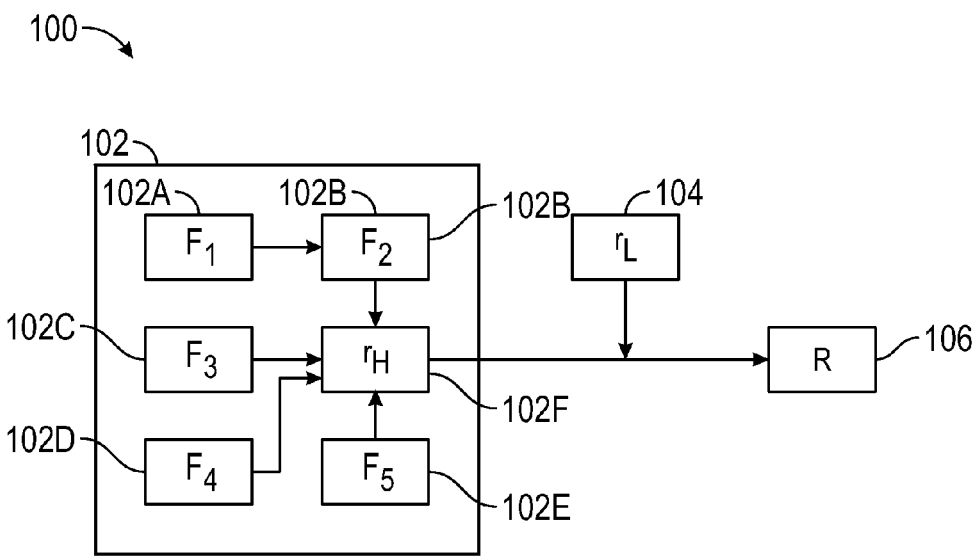
FIG. 2 is a flowchart for a method for determining the high-speed resistance factor ($r_H$), the low-speed resistance factor ($r_L$) and total resistance (R) for the stator windings of FIG. 1.

Referring now to FIG. 2, a flowchart of the method 100 stored on and executable by the controller 40 of FIG. 1 is shown. Method 100 need not be applied in the specific order recited herein. Furthermore, it is to be understood that some steps may be eliminated. The method 100 utilizes estimated magnetic flux (from a magnetic flux sensor 50 or FEA model) and two independent motor torque estimations, such as using current-based (flux map) and active power-based estimates. Referring to FIG. 2, method 100 may begin with step 102, where the controller 40 is programmed or configured to obtain the high-speed resistance factor ($r_H$). Step 102 includes sub-steps 102A through F.

In step 102A of FIG. 2, the controller 40 is programmed or configured to obtain a first function ($F_1$) as a product of a look-up factor and the torque command (T*). The torque command (T*) may be received by the controller 40 in response to an operator input or an automatically-fed input condition monitored by the controller 40. If the device 11 is a vehicle, the controller 40 may determine the torque command (T*) based on input signals from an operator through an accelerator pedal 52 and brake pedal 54, shown in FIG. 1.

To obtain the look-up factor, characterization data is taken at various rotor speeds ($\omega$) at a baseline temperature (C). The baseline temperature (C) may be varied based on the particular application. In one example, the baseline temperature (C) is 90 Celsius. The look-up factor is based at least partially on the rotor speed ($\omega$), the stator winding temperature ($t_S$) and a characterized torque error. The characterized torque error ($\Delta T$) is defined as the difference between a first torque estimate T1 (i.e., torque estimated using a first method) and a second torque estimate T2 (i.e., torque estimated using a second method), such that ($\Delta T = T1 - T2$). The first method of estimating torque may be a current-based flux map method at the baseline temperature (C), as known to those skilled in the art. The second method of estimating torque may be an active power-based method at the baseline temperature (C), as known to those skilled in the art. Any two different methods of estimating torque known to those skilled in the art may be employed.

Figure 3:
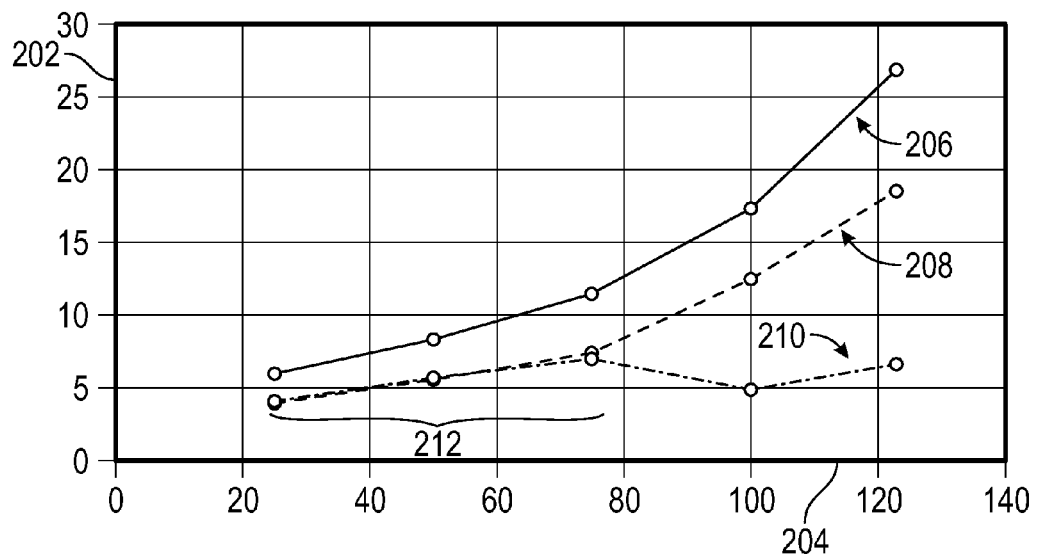
FIG. 3 is an example diagram for obtaining a look-up factor used in the method of FIG. 2.

Referring to FIG. 3, an example diagram for obtaining the look-up factor is shown. In FIG. 3, the vertical axis 202 represents the difference between the torque estimated based on a flux map method versus an active power method [both at the baseline temperature (C)] as a function of speed. The horizontal axis 204 represents the torque command (T*) (in Newton-meters). Traces 206, 208 and 210 represent data at rotor speed values of 1000 rpm, 1500 rpm and 2000 rpm, respectively.

As shown in FIG. 3, the traces 206, 208 and 210 exhibit non-linearities at high commanded torque values, e.g. above approximately 80% of the peak torque command. Referring to FIG. 3, the look-up factor may be taken as the slope of portion 212, where traces 208 and 210 coincide. Any interpolation method known to those skilled in the art may be employed to obtain the look-up factor, such as simple linear approximation or a polynomial curve-fit or any other curve-fitting method. The look-up factor may characterize error between torque estimated from two different methods (both at the baseline temperature) as a function of rotor speed (in this case between 500 and 2000 rpm), up to 80% of peak torque.

In step 102B of FIG. 2, the controller 40 is configured to obtain a second function ($F_2$) as a sum of the first function ($F_1$), a torque achieved ($T_a$) at a rotor temperature and a predefined first constant (Y) such that: $F_2=(F_1+T_a+Y)$. The predefined first constant (Y) may be taken as the y-intercept of the trace portion 208. In one example, the value of Y is taken as 5%. The torque achieved ($T_a$) is understood to be electrical torque and may be defined as a weighted sum of a low-speed torque achieved ($T_{LS}$) and a high-speed torque achieved ($T_{HS}$), such that: $T_a=[(1-K)*T_{LS}+K*T_{HS}]$.

Figure 4:
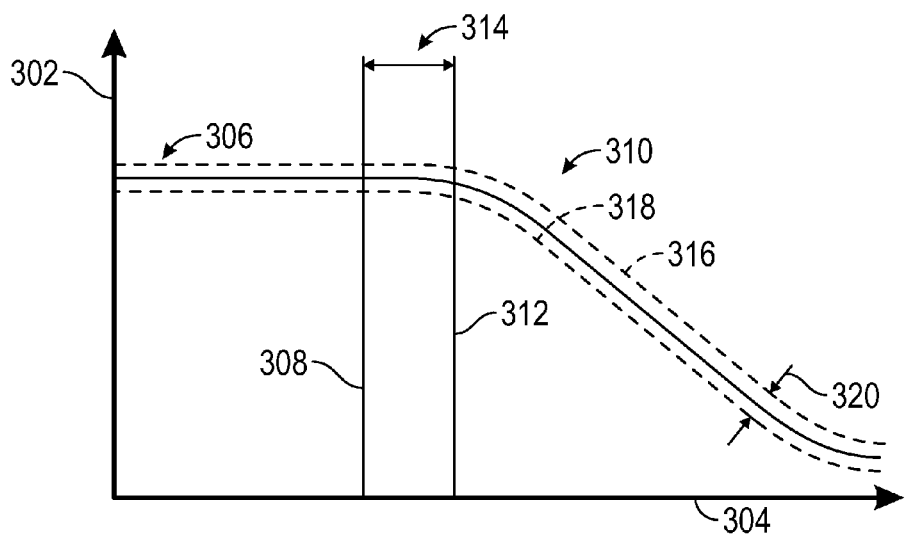
FIG. 4 is an example torque versus machine speed diagram for the assembly of FIG. 1.

FIG. 4 is an example torque versus rotor speed diagram for the machine of FIG. 1 and may be employed to obtain the torque achieved ($T_a$). The data may be obtained in a testing dynamo or lab conditions. In FIG. 4, the vertical axis 302 represents the torque achieved (in Newton-meters) and the horizontal axis 304 represents the motor speed (in RPM). The first portion 306 indicates the low-speed torque achieved ($T_{LS}$) at relatively lower rotor speeds, such as torque speeds lower than first speed ($\omega_1$), indicated by line 308. The second portion 310 indicates the high-speed torque achieved ($T_{HS}$) at relatively higher rotor speeds, such as torque speeds higher than second speed ($\omega_2$), indicated by line 312. The third portion 314 indicates the torque achieved in a "blend zone" with torque speeds between first and second speeds ($\omega_1$ and $\omega_2$). The weighting factor for a particular rotor speed ($\omega$), may be obtained as: $K=(\omega-\omega_1)/(\omega_2-\omega_1)$. The upper boundary 316 and lower boundary 318 show the limits of error 320 of the torque achieved. The low-speed torque achieved ($T_{LS}$) and the high-speed torque achieved ($T_{HS}$) may also be estimated as:

$$T_{LS} = \left[\frac{3}{2}P\Psi_{tr}i_{qe} + \frac{3}{2}P(L_{d0} - L_{q0})i_{de}i_{qe}\right] \text{ and } T_{HS} = \frac{P_{mech}}{\omega_m},$$

$$\text{where } P_{mech} = [P_{dc} - P_{inv_{loss}} - P_{stat_{loss}}].$$

Here, $P_{mech}$ is P defined as the mechanical output power of the machine, $P_{dc}$ is defined as the DC power into the machine 12 and may be obtained as the product of the DC link voltage ($V_{dc}$) (e.g., voltage from a battery pack 56 operatively connected to the machine 12) and the DC current ($i_{dc}$). Additionally, $P_{inv\_loss}$ is defined as the inverter loss (converting DC to AC). It may be a nonlinear polynomial, based on the inverter models known to those skilled in the art. $P_{stat-loss}$ is P defined as the loss or heat dissipated in the stator windings 30. The value of heat dissipated may be characterized or obtained with sensors or FEA models while the machine 12 is not in use.

In step 102C of FIG. 2, the controller 40 is configured to obtain a third function ($F_3$), as a product of a stator winding resistance ($r_C$) at a baseline temperature (C) and a torque achieved ($T_C$) at the baseline temperature (C) such that: $F_3=(T_C*r_C)$. The stator winding resistance ($r_C$) and torque achieved ($T_C$) at the baseline temperature, such as 90 Celsius, may be obtained through measurements in a laboratory setting or test cell.

In step 102D of FIG. 2, the controller 40 is configured to obtain a fourth function ($F_4$) as a difference between a magnetic flux ($\psi_{tr}$) at the rotor temperature and a magnetic flux ($\psi_C$) at the baseline temperature such that: $F_4=(\psi_{tr}-\psi_C)$. The magnetic flux may be measured using a magnetic flux sensor 50 or estimated, as previously described.

In step 102E of FIG. 2, the controller 40 is configured to obtain a fifth function ($F_5$) as a product of the pole pair (P), the rotor speed ($\omega$), a commanded current ($i_d^*$) and an inductance factor ($L_{d0}$) such that: $F_5=[P*\omega*i_d^**L_{d0}]$. The DQ reference frame currents ($i_d, i_q$) are obtained from the detected currents of the motor ($I_a$, $I_b$ and $I_c$) which are transformed to the DQ reference frame using motor position or rotor angle 36 (shown in FIG. 1). A position sensor 51 may be employed to determine the rotor angle 36. The commanded currents ($i_d^*, i_q^*$) are obtained based on the torque command (T*) using look up tables. The inductance (L) of the stator winding may be obtained by any method known to those skilled in the art. In one example, the inductance (L) is obtained as a function of the number of turns in the stator winding (N), the relative permeability of the winding core material ($\mu$), the area of the winding/coil in square meters and the average length of the winding/coil in meters (l), such that: $L=(N^2*\mu*A/l)$.

In step 102F of FIG. 2, the controller 40 is configured to obtain the high-speed resistance factor ($r_H$) based at least partially on the second function ($F_2$), the third function ($F_3$), the fourth function ($F_4$) and the fifth function such that: $r_H=[1/(2*F_2)][2*F_3-(3*F_4*F_5)]$.

In step 104 of FIG. 2, the controller 40 is configured to obtain a low-speed resistance factor ($r_L$) for the stator windings based at least partially on a predefined wire coefficient ($\alpha$), a measured stator resistance ($r_0$) at a predefined measuring temperature ($t_0$), a temperature difference between the stator winding temperature ($t_S$) and a predefined measuring temperature ($t_0$) such that: $r_2=[r_0(1+\alpha*(t_S-t_0)]$. The low-speed resistance factor ($r_L$) accounts for variation in stator resistance when the rotor speed ($\omega$) is relatively low.

In step 106 of FIG. 2, the controller 40 is configured to obtain a total resistance value (R) for the stator windings based at least partially on a weighting factor (k) and the first and low-speed resistance factors such that: $R=[k*r_H+(1-k)*r_L]$ and $0 \leq k \leq 1$.

The weighting factor (k) may be one when the rotor speed ($\omega$) is at or above a predefined high speed threshold (e.g, $\omega \geq$ 5000 rpm). The weighting factor (k) may be zero when the rotor speed ($\omega$) is at or below a predefined low speed threshold (e.g. $w \leq 3000$ rpm).

In summary, execution of the method 100 by the controller 40 determines stator winding resistance at high motor speeds corresponding to the torque command (T*), which includes the effect of AC resistance that is known to change with stator winding temperature. The method 100 utilizes magnetic flux (from a magnetic flux sensor 50 or FEA model) and the difference between two independent torque estimations, such as for example, using current-based (flux map) and active power-based estimates of torque. Stator resistance variation at high speed is non-linear and varies with operating temperature and current. Real time accurate estimation of stator winding resistance allows for improved utilization of the available DC link (such as provided by battery pack 56), thereby increasing peak torque and motor efficiency.

The controller 40 (and execution of the method 100) improves the functioning of the assembly 10 by determining the stator winding resistance of a complex system with minimal calibration required. The controller 40 of FIG. 1 may be an integral portion of, or a separate module operatively connected to, other controllers of the assembly 10.

The controller 40 of FIG. 1 includes a computer-readable medium (also referred to as a processor-readable medium), including any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. An electric machine assembly comprising: an electric machine including a stator and a rotor, the stator having stator windings at a stator winding temperature ($t_s$) and the rotor being configured to rotate at a rotor speed ($\omega$);
   wherein the electric machine defines a number of pole pairs (P);
   a controller operatively connected to the electric machine and configured to receive a torque command (T*);
   wherein, the controller has a processor and tangible, non-transitory memory on which is recorded instructions for executing a method for determining stator winding resistance;
   wherein execution of the instructions by the processor causes the controller to determine a high-speed resistance factor ($r_H$) for the stator windings, the high-speed resistance factor ($r_H$) being based at least partially on the torque command (T*), the stator winding temperature ($t_s$), the rotor speed ($\omega$) and the number of pole pairs (P);
   wherein the controller is configured to determine a low-speed resistance factor ($r_L$) for the stator windings based at least partially on a predefined wire coefficient ($\alpha$), a measured stator resistance ($r_0$) at a predefined measuring temperature ($t_0$), and a temperature difference between the stator winding temperature ($t_s$) and a predefined measuring temperature ($t_0$) such that: $r_L = [r_0 (1 + \alpha \times (t_s - t_0))]$; and
   wherein the controller is further configured to determine a total resistance (R) for the stator windings based at least partially on a weighting factor (k), the high-speed resistance factor ($r_H$) and the low-speed resistance factor ($r_L$) such that: $R = [k \times r_H + (1-k) \times r_L]$ and $0 < k < 1$.

2. The assembly of claim 1, further comprising:
   a first temperature sensor operatively connected to the controller and configured to measure the stator winding temperature ($t_S$);
   a second temperature sensor operatively connected to the controller and configured to measure a rotor temperature; and
   a magnetic flux sensor operatively connected to the controller and configured to measure a magnetic flux of the electric machine.

3. The assembly of claim 1, wherein:
   the weighting factor (k) is one when the rotor speed ($\omega$) is above a predefined high speed threshold; and
   the weighting factor (k) is zero when the rotor speed ($\omega$) is below a predefined low speed threshold.

4. The assembly of claim 1, wherein determining the high-speed resistance factor ($r_H$) includes:
   obtaining a first function ($F_1$), via the controller, as a product of a look-up factor and the torque command (T*), wherein the look-up factor is based at least partially on the rotor speed ($\omega$), the stator winding temperature ($t_S$) and a characterized torque error; and
   wherein the characterized torque error is defined as a difference between two independent estimates of torque produced by the machine.

5. The assembly of claim 4, wherein determining the high-speed resistance factor ($r_H$) includes: obtaining a second function ($F_2$), via the controller, as a sum of the first function ($F_1$), a torque achieved ($T_a$) at a rotor temperature and a predefined first constant (Y) such that: $F_2=(F_1+T_a+Y)$.

6. The assembly of claim 5, wherein determining the high-speed resistance factor ($r_H$) includes: obtaining a third function ($F_3$), via the controller, as a product of a stator winding resistance ($r_C$) at a baseline temperature and a torque achieved ($T_C$) at the baseline temperature such that: $F_3=(T_C*r_C)$.

7. The assembly of claim 6, wherein determining the high-speed resistance factor ($r_H$) includes: obtaining a fourth function ($F_4$), via the controller, as a difference between the magnetic flux ($\psi_{tr}$) at the rotor temperature and the magnetic flux ($\psi_C$) at the baseline temperature such that: $F_4=(\psi_{tr}-\psi_C)$.

8. The assembly of claim 7, wherein determining the high-speed resistance factor ($r_H$) includes: obtaining a fifth function ($F_5$), via the controller, as a product of the pole pair (P), the rotor speed ($\omega$), a commanded current ($i_d^*$) and an inductance factor ($L_{d0}$) such that: $F_5=[P*\omega*i_d^**L_{d0}]$.

9. The assembly of claim 8, wherein determining the high-speed resistance factor ($r_H$) includes obtaining the high-speed resistance factor ($r_H$) based at least partially on the second function ($F_2$), the third function ($F_3$), the fourth function ($F_4$) and the fifth function ($F_5$) such that: $r_H=[1/(2*F_2)][2*F_3-(3*F_4*F_5)]$.

10. A method for determining stator winding resistance in an electric machine assembly, the electric machine assembly including an electric machine with a stator having stator windings, a rotor configured to rotate at a rotor speed ($\omega$) and a controller operatively connected to the electric machine, the controller having a processor and tangible, non-transitory memory, the method comprising:

determining a high-speed resistance factor ($r_H$) for the stator windings based at least partially on the torque command (T*), the stator winding temperature ($t_s$), the rotor speed ($\omega$) and the number of pole pairs (P);

determining a low-speed resistance factor ($r_L$) for the stator windings based at least partially on a predefined wire coefficient ($\alpha$), a measured stator resistance ($r_0$) at a predefined measuring temperature ($t_0$), a temperature difference between the stator winding temperature ($t_s$) and a predefined measuring temperature ($t_0$) such that: $r_L=[r_0(1+\alpha\times(t_s-t_0))]$;

determining a total resistance (R) for the stator windings based at least partially on a weighting factor (k), the high-speed resistance factor ($r_H$) and the low-speed resistance factor ($r_L$) such that: $R=[k\times r_H+(1-k)\times r_L]$ and $0<k<1$;

and controlling the electric machine based upon the total resistance (R) for efficiency.

11. The method of claim 10, wherein determining the high-speed resistance factor ($r_H$) includes:

obtaining a first function ($F_1$) as a product of a look-up factor and the torque command (T*), wherein the look-up factor is based at least partially on the rotor speed ($\omega$), the stator winding temperature ($t_S$) and a characterized torque error.

12. The method of claim 11, wherein determining the high-speed resistance factor ($r_H$) includes:

obtaining a second function ($F_2$) as a sum of the first function ($F_1$), a torque achieved at the rotor temperature ($T_{tr}$) and a predefined first constant (Y) such that: $F_2=(F_1+T_{tr}+Y)$; and obtaining a third function ($F_3$) as a product of a stator winding resistance ($r_C$) at a baseline temperature and a torque achieved ($T_C$) at the baseline temperature such that: $F_3=(T_C*r_C)$.

13. The method of claim 12, wherein determining the high-speed resistance factor ($r_H$) includes:

obtaining a fourth function ($F_4$) as a difference between a magnetic flux ($\psi_{tr}$) at a rotor temperature and a magnetic flux ($\psi_C$) at a baseline temperature such that: $F_4=(\psi_{tr}-\psi_C)$.

14. The method of claim 13, wherein determining the high-speed resistance factor ($r_H$) includes:

obtaining a fifth function ($F_5$) as a product of the pole pair (P), the rotor speed ($\omega$), a commanded current ($i_d^*$) and an inductance factor ($L_{d0}$) such that: $F_5=[P*\omega*i_d^**L_{d0}]$.

15. The method of claim 14, wherein determining the high-speed resistance factor ($r_H$) includes:

obtaining the high-speed resistance factor ($r_H$) based at least partially on the second function ($F_2$), the third function ($F_3$), the fourth function ($F_4$) and the fifth function ($F_5$) such that: $r_H=[1/(2*F_2)][2*F_3-(3*F_4*F_5)]$.

* * * * *